(12) United States Patent
Boury (10) Patent No.: US 10,488,464 B2
(45) Date of Patent: Nov. 26, 2019

(54) MAGNETIC SENSOR CIRCUIT FOR SECURITY SENSING

(71) Applicant: Melexis Technologies NV, Tessenderlo (BE)

(72) Inventor: Bruno Boury, Kontich (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 15/349,071

(22) Filed: Nov. 11, 2016

(65) Prior Publication Data

US 2017/0131356 A1    May 11, 2017

Related U.S. Application Data

(60) Provisional application No. 62/253,953, filed on Nov. 11, 2015.

(51) Int. Cl.
| | |
|---|---|
| *G01R 31/327* | (2006.01) |
| *H01H 36/00* | (2006.01) |
| *G01R 33/00* | (2006.01) |
| *G08B 13/08* | (2006.01) |
| *G08B 13/24* | (2006.01) |

(52) U.S. Cl.
CPC ..... *G01R 31/3274* (2013.01); *G01R 31/3275* (2013.01); *G01R 33/00* (2013.01); *G08B 13/08* (2013.01); *G08B 13/24* (2013.01); *H01H 36/0073* (2013.01)

(58) Field of Classification Search
None
See application file for complete search history.

(56) References Cited

U.S. PATENT DOCUMENTS

| | | | | |
|---|---|---|---|---|
| 3,732,555 | A | * | 5/1973 | Strenglein ................ G01V 3/12 340/426.1 |
| 2008/0042834 | A1 | | 2/2008 | Daughton et al. |
| 2011/0227567 | A1 | * | 9/2011 | Reidmueller .......... G01D 5/145 324/244 |
| 2011/0227735 | A1 | | 9/2011 | Fawcett et al. |
| 2013/0265162 | A1 | | 10/2013 | Buckley et al. |

(Continued)

FOREIGN PATENT DOCUMENTS

| | | |
|---|---|---|
| JP | 2015021334 A | 2/2015 |
| WO | 2014138776 A1 | 9/2014 |

OTHER PUBLICATIONS

Belgium Search Report from BE Application No. 201605850, dated May 15, 2017.

*Primary Examiner* — Douglas X Rodriguez
(74) *Attorney, Agent, or Firm* — Workman Nydegger (57) ABSTRACT

A sensor circuit for sensing a circuit change, e.g. circuit break, is described. It comprises a permanent or electro magnet for generating a magnetic field, a sensing system comprising one or more magnetic sensors configured for sensing an at least one dimensional magnetic field from the permanent magnet and for providing an output signal representative of said at least one dimensional magnetic field. The circuit also comprises a controller for detecting an event by comparing said output signal with reference data, said reference data comprising for at least one direction of said magnetic field a reference range having an upper boundary and a lower boundary wherein the upper boundary and lower boundary are magnetically unipolar.

17 Claims, 3 Drawing Sheets

(56) References Cited

U.S. PATENT DOCUMENTS

| | | | |
|---|---|---|---|
| 2014/0266176 A1 | 9/2014 | Fernandez et al. | |
| 2015/0348385 A1* | 12/2015 | Lamb | G08B 13/08 340/547 |
| 2015/0355014 A1* | 12/2015 | Deak | G01F 23/74 73/313 |
| 2017/0356758 A1* | 12/2017 | Aylesbury | G01D 5/142 |

* cited by examiner

MAGNETIC SENSOR CIRCUIT FOR SECURITY SENSING

FIELD OF THE INVENTION

The present invention relates to the field of magnetic sensing. More particularly, the present invention relates to methods and systems for magnetic sensing for security, such as for example home security.

BACKGROUND OF THE INVENTION

Figure 1:
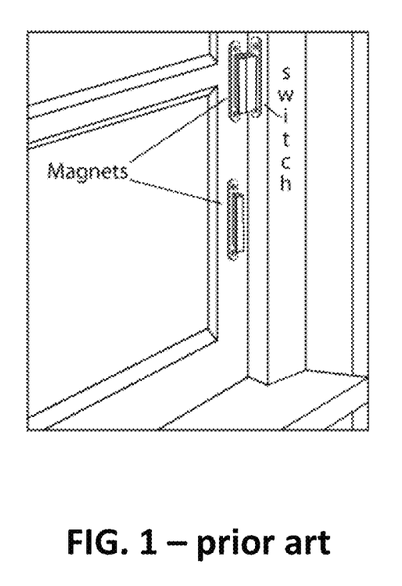
FIG. 1 illustrates a schematic overview of a circuit breakers as generally applicable.

In home security, magnetic circuit breakers are often used to detect that a window/door is closed. In doing so, in essence the magnetic field along 1 direction (typically perpendicular to the IC surface) is compared with a user-defined threshold. This system provides good functionality, as contact-less magnetic position sensing is robust against dirt, which could otherwise affect other technologies such as optical circuit breakers, and it is also robust against wear & tear, as contacting solutions such as microswitches or mechanical relays. FIG. 1 illustrates a conventional setup for a circuit breaker.

As such, magnetic circuit breakers are very popular in home security systems and other (non-) secure closure detection systems, such as white goods closure detection and emergency exits.

Typically, magnetic circuit breakers are characterized by the fact that the switching threshold is either factory trimmed at the sensor's IC manufacturer, or it is trimmed end-of-line at the module or equipment manufacturer. This means that the switching accuracy is still exposed to any dynamic variations over time: window not closing as well as it used to or air gap change over temperature and time.

Figure 2:
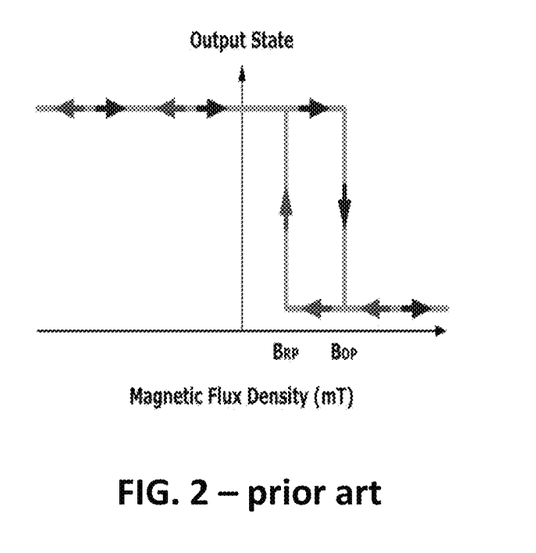
FIG. 2 illustrates a detection of an event using a conventional exceeding of a threshold, as used in the state of the art.

The principle of operation is as follows. In essence the switching point Bop is crossed when the window is closed and then the alarm will go off (OFF state) whenever the magnetic field has dropped below the BRP point. Bop and Brp can be the same value, but typically hysteresis is intentionally introduced so as to avoid false tripping back and causing chattering condition (switching in and out all the time due to noise). The latter is illustrated in FIG. 2. The comparison function of a switch (reed sensor or CMOS magnetic sensor) in systems used is typically a 1-bit information to check if the magnetic field is higher than a predefined threshold in absolute value. This means that the accepted region (switch considered closed) is open-ended, and not a narrow region. In essence the magnetic circuit breaker will compare an absolute threshold (be it a factory trimmed one or programmed end of line) with the measured magnetic field. Malicious people could take advantage of that by applying an additional external magnetic field, making the sensor believe the magnet is still in front of him when the magnet is pulled away. The external tampering field just needs to be at least as big as the one induced by the magnet from the circuit breaker and then the system is fooled that the window is still closed.

SUMMARY OF THE INVENTION

It is an object of embodiments of the present invention to provide efficient methods and systems for sensing opening or closing of a circuit, e.g. for security sensing.

It is an advantage of at least some embodiments of the present invention that the sensor can be adapted to changes in the environment over time, for example adjustment to changes due to temperature, air gap changes, etc.

It is an advantage of at least some embodiments of the present invention that an increased tamper protection is provided e.g. allowing to detect using external magnetic fields in a tamper attempt.

It is an advantage of at least some embodiments of the present invention that tampering becomes virtually impossible because for tampering one would need highly specialized equipment in a highly controlled environment to accurately set the magnetic field in 3D.

It is an advantage of at least some embodiments of the present invention that the sensor may comprise a micro power functionality.

It is an advantage of at least some embodiments of the present invention that the sensor can be adjusted by the user, thus resulting in a sensor that is tuneable to the situation of the user.

It is an advantage of at least some embodiments of the present invention that an easy interrupt and mode setting can be achieved.

The above objective is accomplished by a method and device according to the present invention.

The present invention relates to a sensor circuit for sensing a circuit change, e.g. a circuit break, the sensor circuit comprising a permanent or electro magnet for generating a magnetic field, a sensing system comprising one or more magnetic sensors configured for sensing an at least one dimensional magnetic field from the permanent magnet, and for providing an output signal representative of said at least one dimensional magnetic field, and a controller for detecting an event by comparing said output signal with reference data, said reference data comprising for at least one direction of said magnetic field a reference range having an upper boundary and a lower boundary wherein the upper boundary and lower boundary are magnetically unipolar.

It is an advantage of at least some embodiments that it is hard to tamper the system by saturating with an external magnetic field. The provision of an allowed range rather than a specific one level threshold results in an improved tamper proof system. Where in embodiments of the present invention reference is made to the upper boundary and lower boundary of the range being magnetically unipolar, reference is made to boundary values corresponding with the same magnetic polarity, i.e. either both a south pole or either both a north pole. The range consequently is not a range centered around 0 Gauss and comprising both positive and negative magnetic field strengths.

Comparing said output signal with said reference data may comprise, for a magnetic field sensed in at least one direction, evaluating whether values for at least one direction of said sensed magnetic field fall within said reference range having an upper boundary and a lower boundary which are magnetically unipolar.

It is an advantage of at least some embodiments that it is not possible to tamper the system by saturating with an external magnetic field. The provision of an allowed range rather than a specific one level threshold results in an improved tamper proof system.

Said reference data may comprise for more than 1 dimension, e.g. in 2 dimensions or in 3 dimensions, a reference range having an upper boundary and a lower boundary wherein the upper boundary and lower boundary are magnetically unipolar.

Said controller may be furthermore adapted for dynamically adjusting said reference data to conditions of the sensing system in use. It is an advantage of embodiments of the present invention that the sensor can re-memorize its magnetic environment whenever it is requested. It is an advantage of embodiments of the present invention that the system is able to cope with variations. It is an advantage of embodiments of the present invention that a reference can be recorded at enablement of the sensor system, or for example at predetermined times, so that, instead of having the function set in the factory, variations can be taken into account. This advantageously results in significantly reducing the error budget of the system by elimination of the dynamic tolerances (e.g. mechanical tolerances when closing the door/window over lifetime).

It is an advantage of embodiments of the present invention that an at least 2 dimensional magnetic field is measured, since the latter results in an increased tamper proof system. Mimicking of an at least 2-dimensional magnetic field is hard outside a laboratory environment, rendering it far more difficult for persons to tamper the system.

The boundary values of the reference range may be programmably settable by the user, at factory level or at runtime level.

It is an advantage of embodiments of the present invention that not only the average level can be set but also that the boundaries of the range determining the interval for deriving an event can be set. The latter assists in accurate detection.

Said sensing system for sensing said at least one dimensional magnetic field may be a sensing system for sensing an at least two dimensional magnetic field.

It is an advantage of embodiments of the present invention that the sensor circuit comprises a sensing system for sensing a magnetic field in three distinct directions. It is virtually impossible to mimic a three dimensional magnetic field, thus resulting in a system that is tamper proof for tampering using an external magnetic field.

Said sensing system for sensing said at least one dimensional magnetic field may be a sensing system for sensing a three dimensional magnetic field.

The sensing system for sensing the magnetic field may have a gain adjustment which compensates for the variation in magnetic remanence of a permanent magnet over temperature employed in the system.

It is an advantage of embodiments of the present invention that a reduction of the range for detecting an event can be obtained, allowing accurate detection.

The sensing system may comprise a single sensor for sensing a two or three dimensional magnetic field.

The sensor circuit may comprise a power unit configured for automatically activating magnetic measurement at programmable time intervals without the need for an external trigger before each measurement.

It is an advantage of embodiments of the present invention that a reduced overall power consumption is obtained with the sensor circuit.

The sensor circuit furthermore may comprise an RF receiver, wherein the system is configured for using a trigger from the RF receiver to the magnetic sensing system to memorize the magnetic environment of the sensor circuit.

The sensing of a magnetic environment may comprise sensing calibration data for the magnetic field induced by the environment of the sensor circuit.

The trigger may be level based. The trigger may be edge based.

The sensor circuit may comprise an RF transmitter, wherein the system may be configured for transmission of a detection event by the one or more sensors of the sensing system.

The detection event may be level based. The detection event may be edge based. The detection event may be representative of a circuit being broken, e.g. by a window that is opened, e.g. when an intrusion occurs.

The RF receiver and RF transmitter may be combined in a single RF transceiver.

The RF receiver and RF transmitter may be combined with the one or more sensor.

The magnetic sensor may be configured for measuring a supply voltage and for sending a control signal for indicating a low energy status of a local powering source.

It is an advantage of embodiments of the present invention that the system can be made autonomous and that it can send a message to a home beacon that the battery is low and needs replacement.

The sensor circuit may be configured for comparing digitally or in an analog way a sensing signal from the sensing system with a threshold.

The sensor circuit may comprise an interrupter, wherein the output of the comparison is directly connected to the sensor circuit interrupter.

The present invention also relates to the use of a sensor circuit as described above for security applications.

The present invention also relates to the use of a sensor circuit as described above for home security applications.

The present invention also relates to a method for sensing a circuit break, the method comprising
  inducing a permanent magnetic field
  sensing said permanent magnetic field and providing an output signal representative of said permanent magnetic field, and
  detecting an event by comparing said output signal with reference data, said comparing comprising comparing an output signal representative of values of the sensed magnetic field in at least one direction with a reference range having an upper boundary and a lower boundary wherein the upper boundary and lower boundary are magnetically unipolar.

Comparing said output signal with said reference data may comprise, for a sensed magnetic field sensed in at least one direction, evaluating whether values for at least one direction of said sensed magnetic field fall within said reference range having an upper boundary and a lower boundary which are magnetically unipolar.

Comparing said output signal with said reference data may comprise, for a sensed magnetic field sensed in multiple directions, evaluating whether values for different directions of said sensed magnetic field fall within said different reference ranges for said different directions, said reference ranges having an upper boundary and a lower boundary which are magnetically unipolar.

Said method may comprise dynamically adjusting said reference data to conditions of the sensing system in use.

The method may comprise dynamically adjusting the boundary values of said one or more reference ranges at runtime level.

The method may comprise sensing a two or three dimensional magnetic field.

The method may comprise automatically activating magnetic measurement for obtaining calibration data for the magnetic field influence of the environment at programmable time intervals without the need for an external trigger.

The method may comprise transmitting a detection event by the one or more sensors of the sensing system.

The method may comprise measuring a supply voltage and sending a voltage detection event signal for indicating a low energy status of a local powering source.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

DETAILED DESCRIPTION OF ILLUSTRATIVE EMBODIMENTS

The present invention will be described with respect to particular embodiments and with reference to certain drawings but the invention is not limited thereto but only by the claims. Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to an event detection, reference may be made to a change in magnetic field sensed in the sensing system. The latter may for example be caused by the movement of a certain component, e.g. opening or closing of a door, window, etc., the displacement of a structural element, etc.

In a first aspect, the present invention relates to a sensor circuit for sensing a circuit change, e.g. a circuit break. According to embodiments of the present invention, the sensor circuit may for example be advantageously used for security monitoring, such as for home security monitoring like detection of the opening or closing of doors, windows, etc. although embodiments are not limited thereto. According to embodiments of the present invention, the sensor circuit comprises a permanent magnetic field generating element. Such a permanent magnetic field generating element may be for example a permanent magnet, but alternatively also may be for example an electro magnet for generating the magnetic field. The permanent magnetic field provides a magnetic field contribution at least in one direction. In some advantageous embodiments, the permanent magnetic field may extend also in a second direction or even in a second and third direction. In the latter case, reference is made to a two or three dimensional magnetic field that is generated, whereas in the first situation in principle use can be made of a one dimensional magnetic field, i.e. a magnetic field that is substantially extending in one direction. The latter may in some embodiments of the present invention advantageously be used for increasing the tamperproofness of the system.

According to embodiments of the present invention, the sensing circuit also comprises a sensing system. Such a system may comprise a single magnetic sensor or may comprise a combination of magnetic sensors. The one or more magnetic sensors thereby is configured so as to measure/detect a magnetic field strength (from the magnetic field generating element) at least in one direction. The sensing system furthermore is adapted for providing an output signal representative of said at least one dimensional magnetic field. Independent of whether a one dimensional, two dimensional or three dimensional magnetic field is generated, the sensing system may be adapted to only measure the magnetic field or magnetic field variation in one direction. In some embodiments, the sensing system is adapted for detecting the magnetic field or magnetic field variation in two distinct directions. In some embodiments, the sensing system is adapted for detecting the magnetic field or magnetic field variation in three distinct directions, e.g. covering a three dimensional space.

Further according to embodiments of the present invention, the sensor circuit also comprises a controller for detecting an event by comparing said output signal with reference data, said reference data comprising for at least one direction of said magnetic field a reference range having an upper boundary and a lower boundary wherein the upper boundary and lower boundary are magnetically unipolar. As indicated above, the boundaries being magnetically unipolar means that they both have the same polarity, i.e. south or north. Since the output value is compared with a range, or in other words with an upper boundary and a lower boundary of a range, the system comprises a 2-level comparator. The latter can be implemented in any suitable way, e.g. in software or in hardware.

Figure 5:
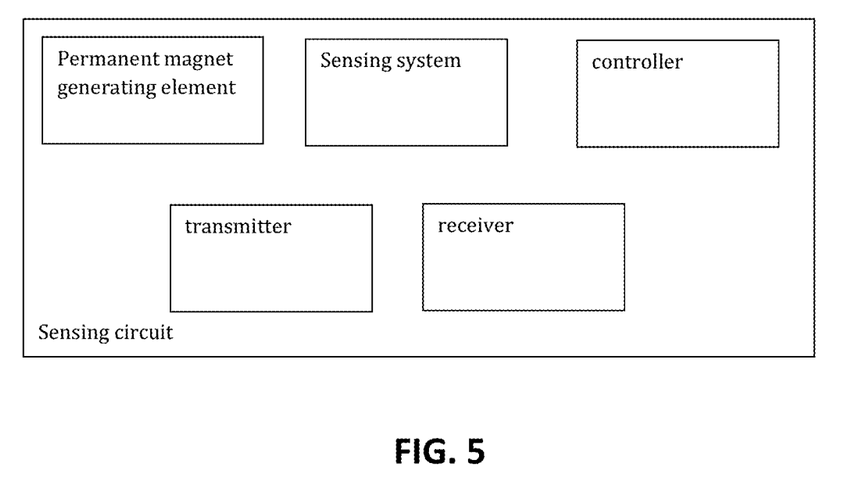
FIG. 5 illustrates a schematic representation of an exemplary system according to an embodiment of the present invention.

FIG. 5 provides a schematic representation of a system according to an exemplary embodiment of the present invention. FIG. 5 illustrates a sensing circuit comprising a magnetic field generating element, a sensing system comprising one or more magnetic sensors for sensing the magnetic field in at least one direction, and a controller for evaluating an output signal of the sensing system representative of the sensed magnetic field in at least one direction by comparing it to a reference, wherein the reference comprises a range for the magnetic field in the at least one direction the range being defined by an upper and lower boundary corresponding with the same magnetic polarity. Other features that may be present are transmitting and/or receiving component for communicating with external components of a security system. The transmitter and/or receiver may be implemented as a transceiver. In some embodiments, the transmitter and/or receiver may be implemented as part of the sensing circuit, i.e. as part of the magnetic sensing chip.

By way of illustration, some features and some principles of embodiments of the present invention will be further illustrated by way of some exemplary embodiments of the present invention, the present invention not being limited thereto or thereby.

In one exemplary embodiment, whenever e.g. an alarm system is enabled, a function is called which makes each sensor remember its surrounding magnetic state, i.e. the Bx, By, Bz magnetic flux density components. Instead of having this function set at time t=0 in the factory, the system will be able to cope with variations of e.g. the closing of a window, reducing significantly the error budget of the system by elimination of the dynamic tolerances (e.g. mechanical tolerances when closing the door/window many times).

In one exemplary embodiment, comparison of the output value of the sensing system is performed by comparing it with 2 (upper/lower) boundaries for each axis instead of a threshold it is no longer possible to tamper with the system by saturating with an external magnetic field. In doing so, an "allowed region" is defined, instead of an open-ended system which is not robust against tampering. The controller thus comprises a two level comparator.

In one exemplary embodiment, a 3D magnetic field is sensed. This results in the fact that it is no longer possible to mimic the magnetic field coming from a magnetization source. 1D field setting—not caring about the other 2 dimensions in principle can be set or mimicked and thus leaves open space for tampering the system. But a 3D field setting when not using laboratory equipment (and knowing that accurate field settings is only realistically possible using a 3D HelmHoltz coil, and in the center of the equipment only) is virtually impossible to do.

In one embodiment, systems according to embodiments of the present invention also may comprise a micropower unit providing the functionality of the sensor waking up by itself on regular programmable intervals, reducing the total power consumption. This waking up may for example be used to memorize the magnetic environment that is present at the moment of waking up, resulting in the fact that the system dynamically adapts the circuit breaker to a changing environment that is not representative of an event. Such effects may for example be caused by a door that does not close as well any more than previously. This may for example be caused by temperature influences, weather influences, etc. According to at least some embodiments of the present invention, the sensor circuit thus may be dynamically adjustable.

According to some embodiments of the present invention, the boundary settings, e.g. for a magnetic field strength range in one direction, in two directions or in three directions, may be programmable by the customer, either at factory level or at runtime when the remote circuit breaker is entering the "memorizing" state, i.e. is memorizing the magnetic field contribution by the environment. It is to be noted that in general, the boundaries for ranges for different directions do not need to be the same or in other words may be different.

According to some embodiments of the present invention, the sensing circuit may have a gain adjustment of the sensor which is inversely proportional to the reduction of magnetic remanence of the permanent magnet employed, enabling a reduction of the allowed measurement band around the magnetic state, e.g. the 3D magnetic state, that was memorized.

In one embodiment, the magnetic circuit breaker design consisting of only an RF transceiver and a sensor. All functionalities then may be performed by the RF transceiver and the sensor. Communication between the 2 ICs may for example be as follows:

A trigger TRG (level or edge based) is given from the RF receiver to the magnetic sensor to go into memory mode, allowing to memorize the last state of the magnetic contribution of the environment.

A signal INT (level or edge based) is given from the magnetic sensor to the RF transmitter to make the alarm go off (intrusion detected) in case an event detection has occurred.

In yet another embodiment, the magnetic circuit breaker design comprises the feature whereby the magnetic sensor also measures its supply voltage in order to transmit another message to the home beacon that battery is low and needs replacement. This may for example be implemented as follows: the ADC value of the voltage VDD/2 is compared with a threshold in digital or analog, and the corresponding output of this check is directly connected to an interrupt.

In one embodiment, memorizing the magnetic surrounding, i.e. creating a magnetic memory representative of a relatively recent magnetic memory, may be performed at multiple occasions throughout the lifetime of the product, at an occasion when the device is explicitly calibrated or at factory level, whereby a default value is programmed. By performing the memorizing at multiple occasions, a dynamic adjustment to the environment can be performed.

In one embodiment, the tolerances defined by the boundaries in the ranges can be set independently for different directions, e.g. for an x, y and z direction wherein sensing is performed. The latter may for example be influenced by the sensors used and their sensitivity in different directions, the fact that different sensitivities may be caused by different influencing of the environment magnetic contribution in the different directions, etc.

In one embodiment, switching threshold may be provided with hysteresis in order to avoid chattering when exposed to magnetic fields at the exact switching threshold.

By way of illustration, embodiments of the present invention not being limited thereto, an exemplary comparison is made between the situation whereby an omnipolar boundary is used, as known for a sensing circuit from the prior art, and the application of unipolar boundaries for a magnetic threshold, as used in embodiments of the present invention. This is shown in FIG. 3 (prior art) and in FIG. 4 (embodiments of the present invention).

Figure 3:
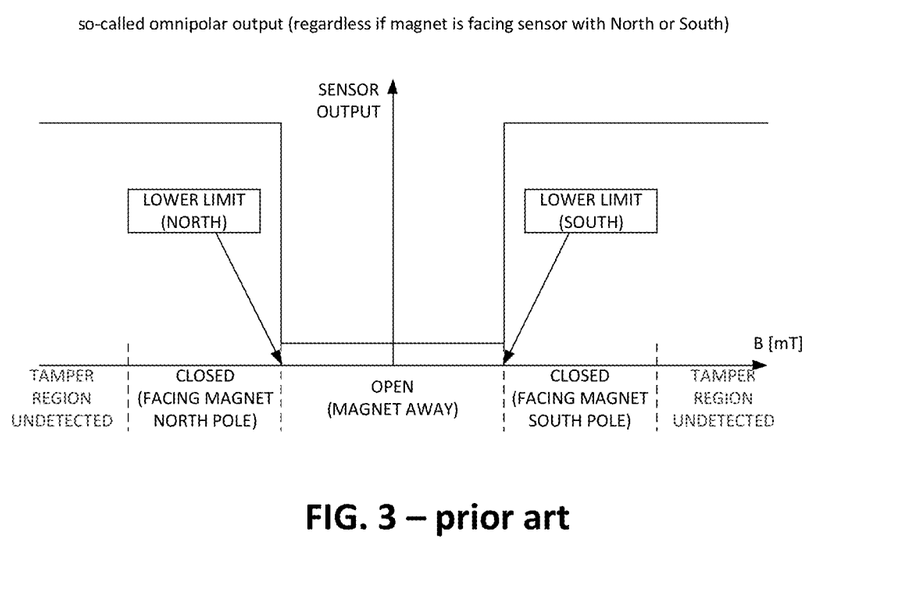
FIG. 3 illustrates a detection scheme for a sensing circuit as known from prior art.

In FIG. 3—prior art the situation is shown whereby, according to prior art, a so-called omnipolar output is created, regardless is the magnet is facing the sensor with its North or South pole). The sensor is indicating an open status when the signal falls in a range centered around 0 Tesla and having a boundary corresponding with lower limit corresponding with a north pole being present, and a boundary corresponding with a lower limit corresponding with a south pole being present. In all other situations the sensor indicates that the system is in a closed state (either facing the magnet south pole or the magnet north pole. When other magnetic fields are used for tampering the system, this is not detected in system according to this prior art.

Figure 4:
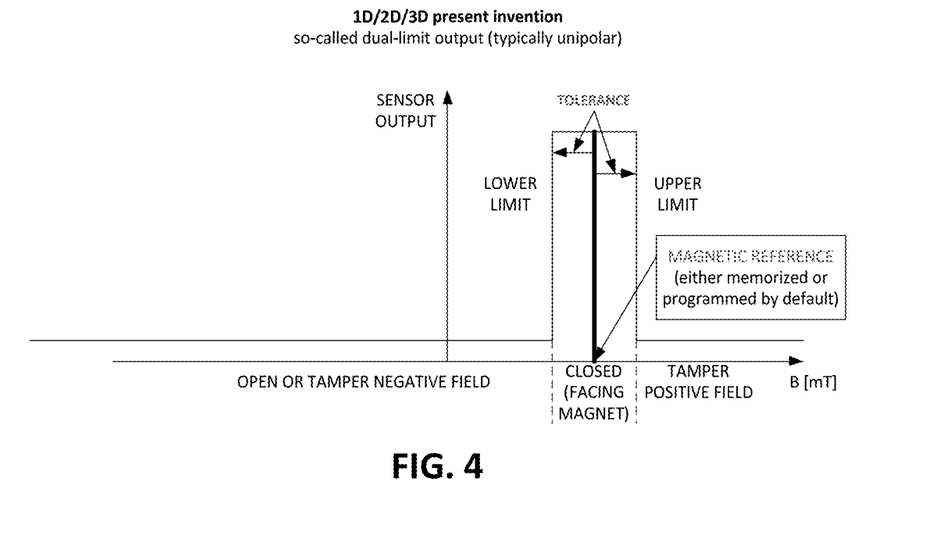
FIG. 4 illustrates a detection scheme for a sensing circuit using a reference range with unipolar boundaries, according to an embodiment of the present invention.

In FIG. 4, the situation is shown wherein, according to embodiments of the present invention, sensing is performed with reference to a range that is not centered at 0 Tesla, but that is set at a specific value different from 0. Furthermore, the boundaries are such that the corresponding values are unipolar, i.e. have the same polarity. In this way the sensor output can be used for detecting a closed state and state wherein the system is open or wherein tampering can be detected. Furthermore, the reference may be set dynamically or set during calibration during installation.

In one aspect, the present invention also relates to the use of a sensor circuit as described in the first aspect for security applications. In one aspect the present invention furthermore relates to the use of a sensor circuit for home security applications.

In yet another aspect, the present invention relates to a security system comprising a sensor circuit as described in the first aspect. Other features and advantages may be as known by the person skilled in the art. For example, the result of the evaluation of the sensing system output signal may be transmitted to a part of the security system external to the sensor circuit and may provide, depending on the output signal, initiate an alarm procedure. Such a part of the security system may comprise an alarm signal generator, a separate processing means, an input/output device for arming/de-arming the alarm, a powering system for generating the alarm signal, etc. Some of these features may also be directly included in the sensor circuit.

In still another aspect, the present invention relates to a method for sensing a circuit break, the method comprising inducing a permanent magnetic field, sensing said permanent magnetic field and providing an output signal representative of said permanent magnetic field, and detecting an event by comparing said output signal with reference data, said comparing comprising comparing an output signal representative of values of the sensed magnetic field in at least one direction with a reference range having an upper boundary and a lower boundary wherein the upper boundary and lower boundary are magnetically unipolar. Other method steps may be as described above or may correspond with the functionality of features of the sensing circuit.

The invention claimed is:

1. A sensor circuit for sensing a circuit change, the sensor circuit comprising:
 a permanent or electro magnet for generating a magnetic field,
 a sensing system comprising one or more magnetic sensors configured for sensing the magnetic field at least in one direction, and for providing an output signal representative of said sensed magnetic field in the at least one direction, and
 a controller for detecting an event by comparing said output signal with reference data, said reference data comprising for at least one direction of said magnetic field a closed reference range having an upper boundary and a lower boundary within the closed reference range, wherein the upper boundary and lower boundary are magnetically unipolar, and by evaluating whether said output signal falls within the closed reference range having the upper boundary and the lower boundary such that external pertubation by an external field is detected when said output signal falls outside of the closed reference range.

2. A sensor circuit according to claim 1, wherein said reference data comprises for more than one direction, a closed reference range having an upper boundary and a lower boundary within the closed reference range, wherein the upper boundary and lower boundary are magnetically unipolar.

3. A sensor circuit according to claim 1, wherein said controller is furthermore adapted for dynamically adjusting said reference data to conditions of the sensing system in use.

4. A sensor circuit according to claim 3, wherein the upper and lower boundaries of the closed reference range are programmably settable by the user, at factory level or at runtime level.

5. A sensor circuit according to claim 1, wherein said sensing system for sensing said magnetic field at least in one direction is a sensing system for sensing an at least two dimensional magnetic field or a three dimensional magnetic field.

6. A sensor circuit according to claim 1, wherein the sensing system for sensing the magnetic field has a gain adjustment which compensates for the variation in magnetic remanence of the permanent magnet over temperature employed in the system.

7. A sensor circuit according to claim 1, wherein the sensing system comprises a single sensor for sensing a two or three dimensional magnetic field.

8. A sensor circuit according to claim 1, wherein the sensor circuit comprises a power unit configured for automatically activating magnetic measurement at programmable time intervals without the need for an external trigger before each measurement.

9. A sensor circuit according to claim 1, the sensor circuit furthermore comprising an RF receiver, wherein the sensing system is configured for using a trigger from the RF receiver to the magnetic sensing system for memorizing a magnetic environment of the sensor circuit and/or the sensor circuit comprising an RF transmitter, wherein the sensing system is configured for transmission of a detection event by the one or more sensors of the sensing system.

10. A sensor circuit according to claim 9, wherein the RF receiver and RF transmitter is combined in a single RF transceiver and/or is combined with one of the sensor elements.

11. A sensor circuit according to claim 1, wherein the one or more magnetic sensors are configured for measuring a supply voltage and for sending a control signal for indicating a low energy status of a local powering source.

12. A sensor circuit according to claim 1, wherein the sensor circuit is configured for comparing digitally or in an analog way a sensing signal from the sensing system with a threshold.

13. A sensor circuit according to claim 12, the sensor circuit comprising an interrupter, wherein the output of the comparison is directly connected to the interrupter.

14. A sensor circuit according to claim 1, wherein the permanent magnet or the electromagnetic magnet has a fixed position with respect to the one or more magnetic sensors, the sensor circuit furthermore comprising a ferromagnetic target changing the magnetic field seen by the one or more magnetic sensors when the ferromagnetic target is moved.

15. A security system comprising a sensor circuit according to claim 1.

16. A method for sensing a circuit break, the method comprising:
inducing a permanent magnetic field;
sensing said permanent magnetic field and providing an output signal representative of said permanent magnetic field; and
detecting an event by comparing said output signal with reference data, said comparing comprising comparing the output signal representative of values of the sensed magnetic field in at least one direction with a closed reference range having an upper boundary and a lower boundary within the closed reference range wherein the upper boundary and lower boundary are magnetically unipolar;
wherein comparing said output signal with said reference data comprises, for a magnetic field sensed in at least one direction, evaluating whether values for at least one direction of said sensed magnetic field will fall within said closed reference range having an upper boundary and a lower boundary which are magnetically unipolar, such that external pertubation by an external field is detected when said output signal falls outside of the closed reference range.

17. A method according to claim 16, wherein said method comprises dynamically adjusting said reference data to conditions of the sensing system in use and/or dynamically adjusting the upper and lower boundaries of said closed reference range at runtime level.

* * * * *